United States Patent [19]

Figura et al.

[11] Patent Number: 5,488,011

[45] Date of Patent: Jan. 30, 1996

[54] METHOD OF FORMING CONTACT AREAS BETWEEN VERTICAL CONDUCTORS

[75] Inventors: Thomas A. Figura; Kirk D. Prall, both of Boise, Id.

[73] Assignee: Micron Technology, Inc., Boise, Id.

[21] Appl. No.: 336,426

[22] Filed: Nov. 8, 1994

[51] Int. Cl.$^6$ ................................................ H01L 21/8242
[52] U.S. Cl. ............................ 437/60; 437/195; 437/919; 437/984
[58] Field of Search .......................... 437/60, 195, 919, 437/984; 148/DIG. 14

[56] References Cited

U.S. PATENT DOCUMENTS

| | | | |
|---|---|---|---|
| 5,219,793 | 6/1993 | Cooper et al. | 437/195 |
| 5,275,972 | 1/1994 | Ogawa et al. | 437/984 |
| 5,292,677 | 3/1994 | Dennison | 437/52 |

OTHER PUBLICATIONS

*Two–Step Deposited Rugged Surface (TDRS) Storage Node and Self-Aligned Bitline–Contact Penetrating Cell Plate (SAB–PEC) for 64 Mb DRAM STC Cell* by H. Itoh et al. in IEEE 1991 Symposium on VLSI Technology, pp. 9–10.

*Primary Examiner*—Chandra Chaudhari
*Attorney, Agent, or Firm*—Ormiston, Korfanta & Dunbar

[57] ABSTRACT

A method of forming a contact area between two vertical structures. A first layer of material conforming to an extending between vertical sidewalls is covered with a mask layer. The mask layer is patterned and etched to remove the horizontal region of the mask layer between the vertical sidewalls, thereby exposing the first layer of material at the desired location of the contact area, while retaining at least a portion of the vertical regions of the mask layer. Using the remaining vertical regions of the mask layer as etch mask, the exposed portions of the first layer are then etched away to form the contact area. Another aspect of the invention provides a method of making a DRAM that utilizes a capacitor insulating layer over the capacitor second conductor (or cell poly) to self-align the bit line contact to the capacitor second conductor. In accordance with this aspect of the invention, a capacitor is formed over a semiconductor wafer. The capacitor includes a first conductor, a dielectric layer on the first conductor and a second conductor on the dielectric layer. A capacitor insulating layer is formed on the second conductor. The capacitor insulating layer is patterned and etched to expose portions of the second conductor at the desired location of the bit line contact. Then, using the capacitor insulating layer as a hard mask, the exposed portions of the second conductor are etched away in the area in which the bit line contact will subsequently be formed.

18 Claims, 11 Drawing Sheets

METHOD OF FORMING CONTACT AREAS BETWEEN VERTICAL CONDUCTORS

FIELD OF THE INVENTION

The invention relates generally to the formation of Dynamic Random Access Memory devices (DRAMs) and more particularly to a method of forming bit line contacts in stacked capacitor DRAMs.

BACKGROUND OF THE INVENTION

Generally, integrated circuits are mass produced by forming many identical circuit patterns on a single silicon wafer. Integrated circuits, also commonly referred to as semiconductor devices, are made of various materials that may be electrically conductive, electrically nonconductive (insulators) or electrically semiconductive. Silicon, in single crystal or polycrystalline form, is the most commonly used semiconductor material. Both forms of silicon can be made electrically conductive by adding impurities, commonly referred to as doping. Silicon is typically doped with boron or phosphorus. If the silicon is doped with boron, which has one less valance electron than silicon, electron "holes" become the dominant charge carrier and the doped silicon is referred to as P-type silicon. If the silicon is doped with phosphorous, which has one more valance electron than silicon, electrons become the dominant charge carriers and the doped silicon is referred to as N-type silicon.

DRAMs comprise arrays of memory cells which contain two basic components—a field effect access transistor and a capacitor. Typically, one side of the transistor is connected to one side of the capacitor. The other side of the transistor and the transistor gate electrode are connected to external connection lines called a bit line and a word line, respectively. The other side of the capacitor is connected to a reference voltage. Therefore, the formation of the DRAM memory cell comprises the formation of a transistor, a capacitor and contacts to external circuits.

It is advantageous to form integrated circuits with smaller individual elements so that as many elements as possible may be formed in a single chip. In this way, electronic equipment becomes smaller and more reliable, assembly and packaging costs are minimized and circuit performance is improved. The capacitor is usually the largest element of the integrated circuit chip. Consequently, the development of smaller DRAMs focuses in large part on the capacitor. Three basic types of capacitors are used in DRAMs—planar capacitors, trench capacitors and stacked capacitors. Most large capacity DRAMs use stacked capacitors because of their greater capacitance, reliability and ease of formation. For stacked capacitors, the side of the capacitor connected to the transistor is commonly referred to as the "storage node" or "storage poly" and the side of the capacitor connected to the reference voltage is called the "cell poly."

The areas in a DRAM to which electrical connections are made are generally referred to as active areas. Active areas, which serve as source and drain regions for transistors, consist of discrete specially doped regions in the surface of the silicon substrate. As the size of the DRAM is reduced, the size of the active areas and the corridors available for contacts to reach the active areas are also reduced. The chances for leakage or short circuits between the contacts and transistor and capacitor components increases as the cell spacing decreases. Hence, it is desirable to effectively isolate the contacts from the transistor and capacitor components while optimizing the space available to make the contacts. The present invention addresses the problems associated with forming the contact between the bit line and an active area in the substrate, properly aligning this "bit line contact" and isolating it from the capacitor components.

One method of forming bit line contacts is disclosed in U.S. Pat. No. 5,292,677, issued to Dennison on Mar. 8, 1994. Dennison describes a DRAM formation process using an etch stop layer to self-align the bit line contact to the transistor gate electrode. Although this method requires fewer mask steps than other methods, it requires forming and etching insulating spacers in the bit line contact corridor.

Another method of forming a bit line contact is disclosed in Two-Step Deposited Rugged Surface (TDRS) Storage Node and Self-Aligned Bitline-Contact Penetrating Cell Plate (SAB-PEC) for 64 Mb DRAM STC Cell by H. Itoh et al. in IEEE 1991 Symposium on VLSI Technology, pp. 9–10. This process utilizes a bit line contact that passes through the cell poly. To insulate the bit line from the cell poly, sidewall spacers are formed between the transistor gate electrodes. These spacers narrow the corridor for the bit line contact and, consequently, require the use of a poly-silicide bit line since metal would not properly fill the narrow corridor. For very small cell spacing, as in a 64 Mbit DRAM, the bit line corridor would be completely closed off if the cell poly spacer is greater than 0.1 µm. Such thin spacers are difficult to form and may result in an unacceptably large number of devices with cell poly to bit line current leakage.

SUMMARY OF THE INVENTION

One object of the invention is to improve the alignment tolerances between capacitor components and bit line contacts in Dynamic Random Access Memories (DRAMs).

Another object is to effectively isolate capacitor components from bit line contacts and thereby minimize current leakage and short circuits within the DRAM memory cell.

Another object is to eliminate the need for a spacer etch inside deep bit line contact corridors.

According to the present invention, these and other objects and advantages are attained by a method of forming a contact area between two vertical structures. In accordance with one aspect of the invention, a first layer of material conforming to and extending between vertical sidewalls is covered with a mask layer. The mask layer is patterned and etched to remove the horizontal region of the mask layer between the vertical sidewalls, thereby exposing the first layer of material at the desired location of a contact area, while retaining at least a portion of the vertical regions of the mask layer. Using the remaining vertical regions of the mask layer as an etch mask, the exposed portions of the first layer are then etched away to form the contact area.

Another aspect of the invention provides a method of fabricating a DRAM that utilizes a capacitor insulating layer over the capacitor second conductor (or cell poly) to self-align the bit line contact to the capacitor second conductor. In accordance with this aspect of the invention, a capacitor is formed over a semiconductor wafer. The capacitor includes a first conductor, a dielectric layer on the first conductor and a second conductor on the dielectric layer. A capacitor insulating layer is formed on the second conductor. The capacitor insulating layer is patterned and etched to expose portions of the second conductor at the desired location of the bit line contact. Then, using the capacitor insulating layer as a hard mask, the exposed portions of the second conductor are etched away in the area in which the bit line contact will subsequently be formed.

The method of the invention, using the capacitor insulating layer as a mask for subsequent etching, thus allows for improved alignment tolerances between and the bit line contact the capacitor components, and eliminates the need for a spacer etch inside deep bit line contact corridors while minimizing current leakage and short circuits between the bit line contact and the capacitor components.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIGS. 1–7 are cross section views of a portion of a DRAM memory cell at various stages of formation illustrating the preferred embodiment of the invention.

The figures are not meant to be actual views of any particular portion of a DRAM, but are merely idealized representations used to depict the structure and method of the invention.

DETAILED DESCRIPTION OF THE PREFERRED EMBODIMENTS

The present invention will be described in terms of Complementary Metal Oxide Semiconductor (CMOS) technology which is currently the most commonly used integrated circuit technology. The invention, however, may be used in other integrated circuit technologies. CMOS generally refers to any integrated circuit in which both N-channel and P-channel Metal Oxide Semiconductor Field Effect Transistors (MOSFETs) are used in a complementary fashion. CMOS integrated circuits are typically formed with a lightly doped P-type silicon substrate or a lightly doped N-type silicon substrate. The present invention will be described using lightly doped P-type silicon as the starting material, although the invention may be implemented with other substrate materials. If other substrate materials are used, then there may be corresponding differences in materials and structure of the device as is well known in the art.

The formation of integrated circuits includes photolithographic masking and etching. This process consists of creating a photolithographic mask containing the pattern of the component to be formed, coating the wafer with a light-sensitive material called photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist and stripping the remaining photoresist. This photolithographic masking and etching process is referred to herein as "patterning and etching."

Figure 1:
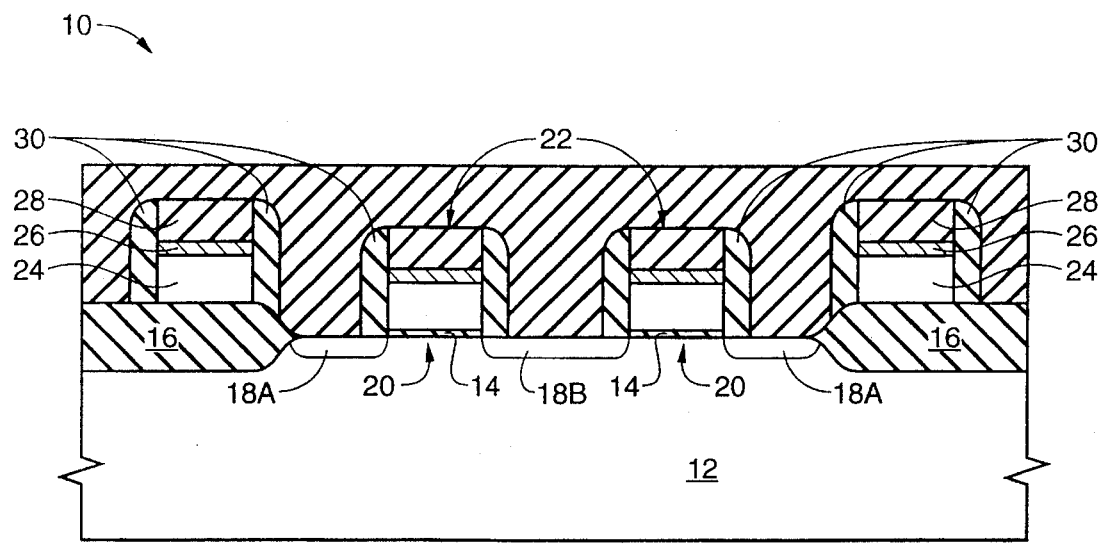

Referring to FIG. 1, wafer 10 comprises a lightly doped P-type single crystal silicon substrate 12 which has been oxidized to form thin gate insulating layer 14 and thick field oxide regions 16. Impurities are implanted in the surface of substrate 12 to form N+ doped source/drain regions 18a and 18b for access transistors 20. Transistor gate electrodes 22 comprise a first doped polysilicon layer 24, a tungsten silicide layer 26 and gate insulating protective layer 28 formed on top of tungsten silicide layer 26. Insulating spacers 30 are formed on either side of transistor gate electrodes 22. Gate insulating protective layer 28 and insulating spacers 30 are preferably made of silicon dioxide. Lower insulating layer 36, made of boro-phospho-silicate glass (BPSG), is then deposited and, if necessary, planarized.

In the above and following discussion, some well-known aspects of DRAM fabrication have been simplified. For example, the structure of the doped source/drain regions generally will be more complex than shown. In addition, the particular materials, structures and processes are intended only to illustrate the invention so that it can be fully understood. Other materials, structures and processes may be substituted for the particular ones described. For example, silicon nitride may be used instead of silicon dioxide for insulating protective layer 28 and spacers 30. Spin-On Glass (SOG), Polyamide Insulator (PI), Chemical Vapor Deposited (CVD) oxide or other insulators may be used in place of the BPSG for lower insulator 36. Other satisfactory materials may be substituted for any of the above. Or, additional materials, structures and processes may also be added to those disclosed.

Figure 2:
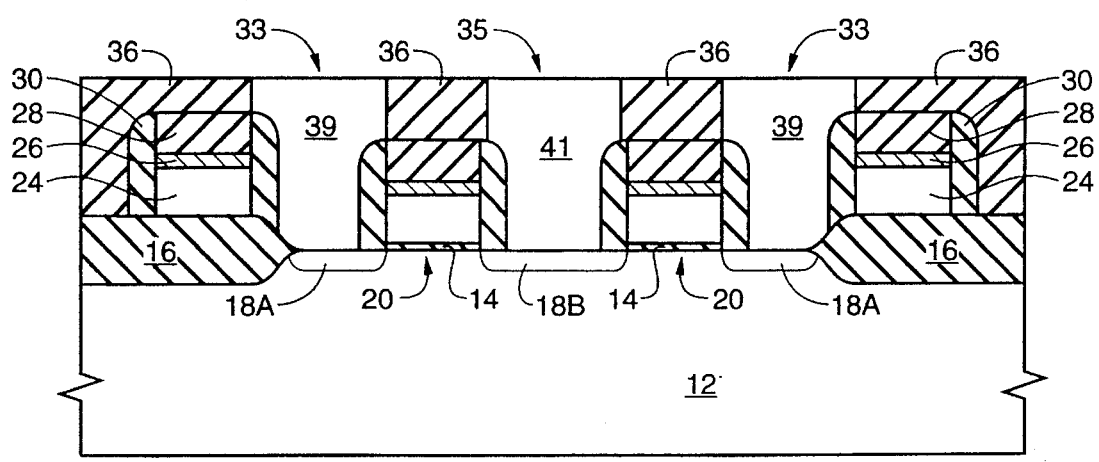
Figure 14:
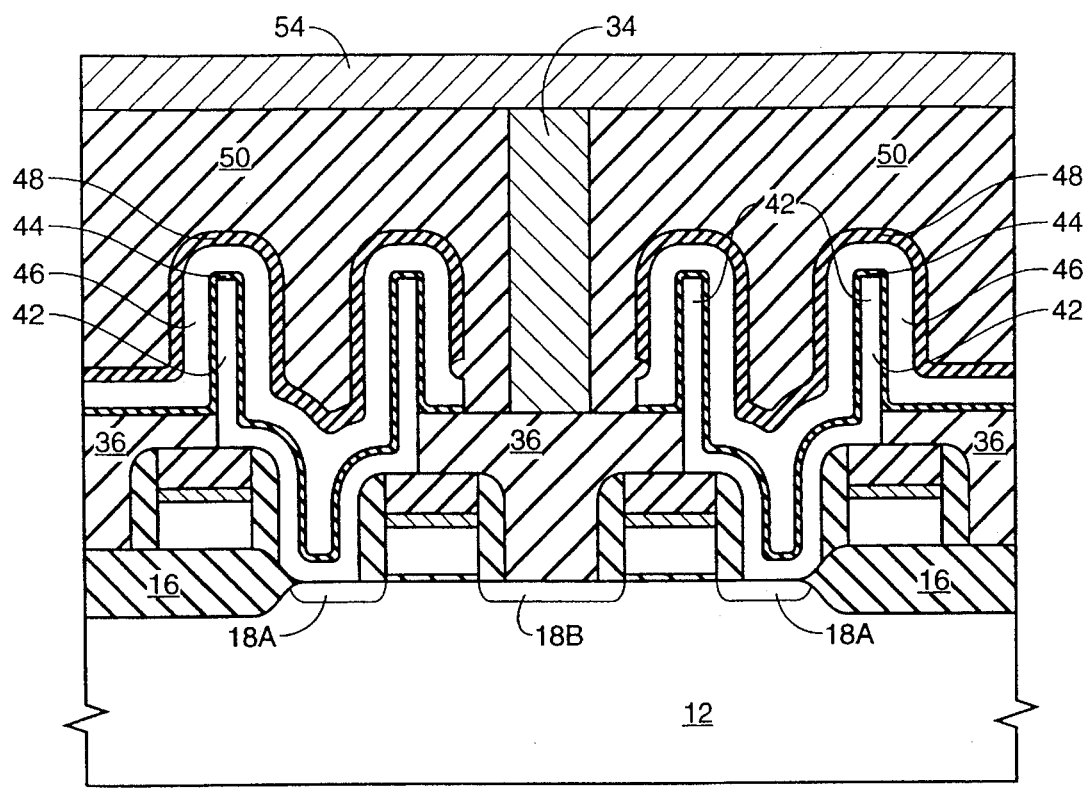

Referring to FIG. 2, lower insulating layer 36 is patterned and etched to define capacitor contact corridors 33 and bit line contact corridor 35, and to expose substrate 12 at source/drain regions 18a and 18b within capacitor and bit line contact corridors 33 and 35, respectively. This etch is preferably an anisotropic Reactive Ion Etch (RIE). Capacitor contact corridors 33 and bit line contact corridor 35 are filled with doped polysilicon to form capacitor contact corridor plugs 39 and bit line contact corridor plug 41. Plugs 39 and 41 electrically connect source/drain regions 18a and 18b to capacitor storage nodes 42 and bit line contact 34, respectively (shown in FIG. 7). Plugs 39 and 41 are planarized as necessary to provide a flat surface for the subsequent deposition of the storage poly. In an alternative embodiment of the invention described below and as shown in FIG. 14, capacitor storage nodes 42 and bit line contact 34 are formed in direct contact with the source/drain regions. The use of poly plug 41 reduces the aspect ratio of the bit line contact corridor and, correspondingly, eliminates the need for a spacer etch inside a deep bit line contact corridor.

Figure 3A:
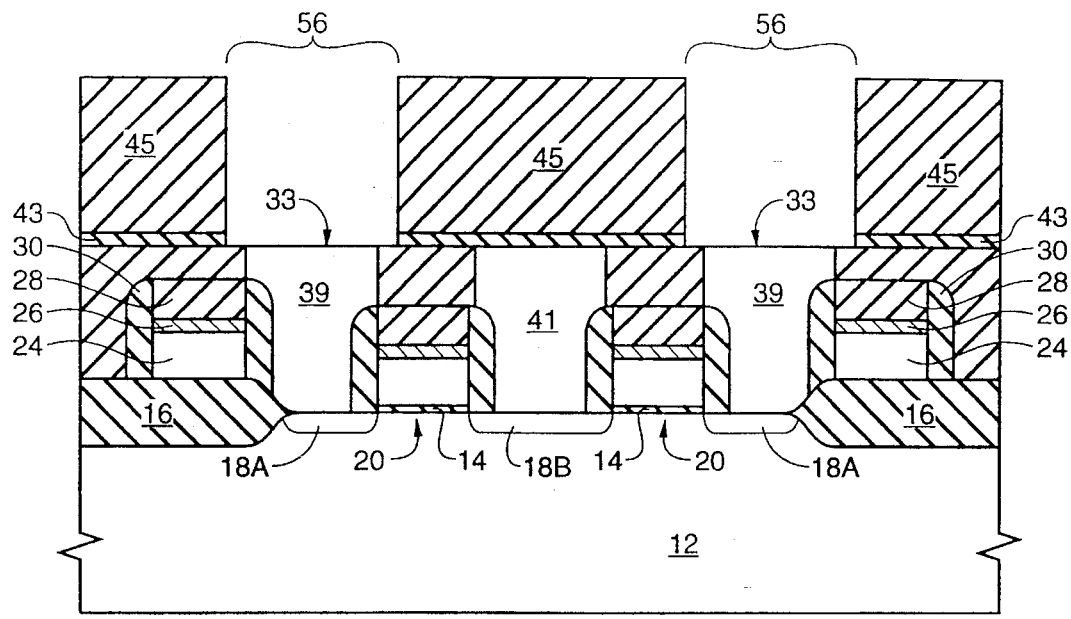

Referring to FIG. 3a, etch stop layer 43, made of silicon nitride or other suitable material, is deposited over the structure previously formed. Thick insulating layer 45 is deposited over etch stop layer 43. Thick insulating layer 45 is patterned and etched with the etch continuing down through etch stop layer 43 to define capacitor container 56.

Figure 3B:
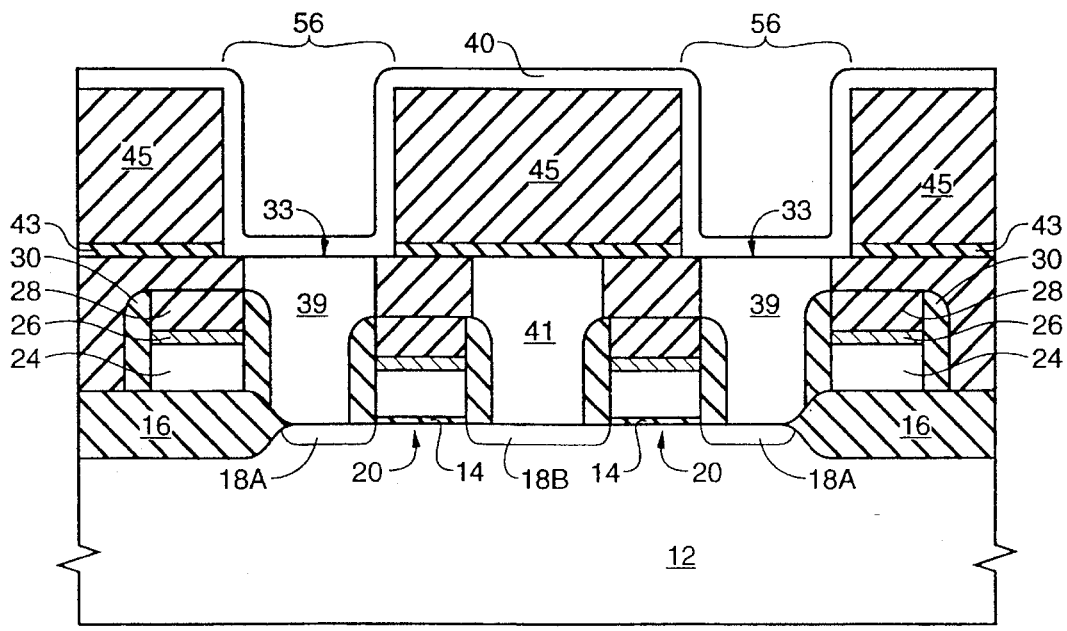
Figure 3C:
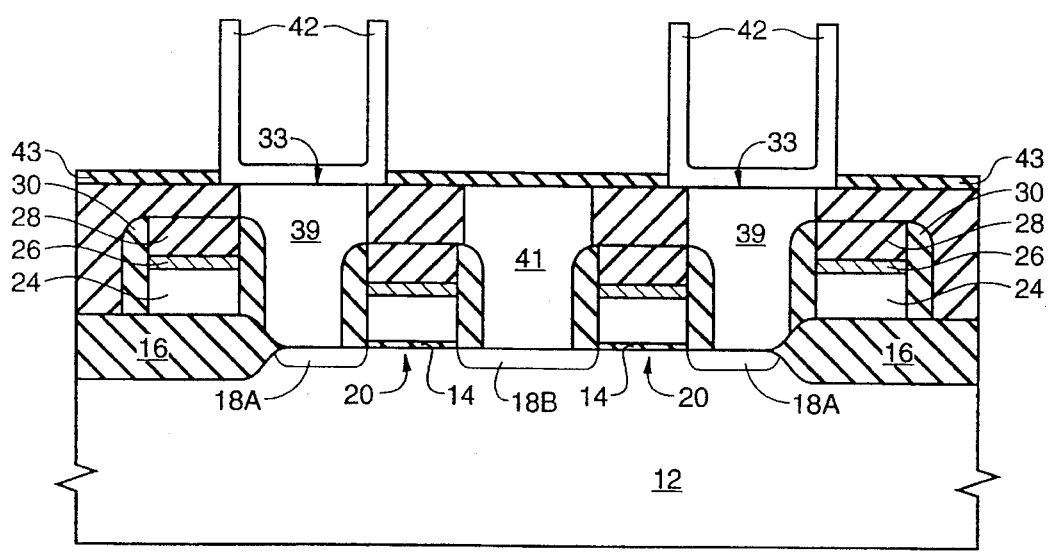

Storage poly 40 is deposited as shown in FIG. 3b. Storage poly 40 may be made of doped polysilicon or doped rough textured polysilicon. Storage poly 40 is patterned and etched to form capacitor storage nodes 42. Thick insulating layer 45 is removed with an oxide etch that is selective to poly so as not to etch the exposed storage poly. This oxide etch to remove thick insulating layer 45 exposes the outer peripheries of storage nodes 42 as shown in FIG. 3c and significantly increases the capacitance area of the cell. Storage nodes 42 are also referred to herein as the capacitor first conductor.

Figure 4:
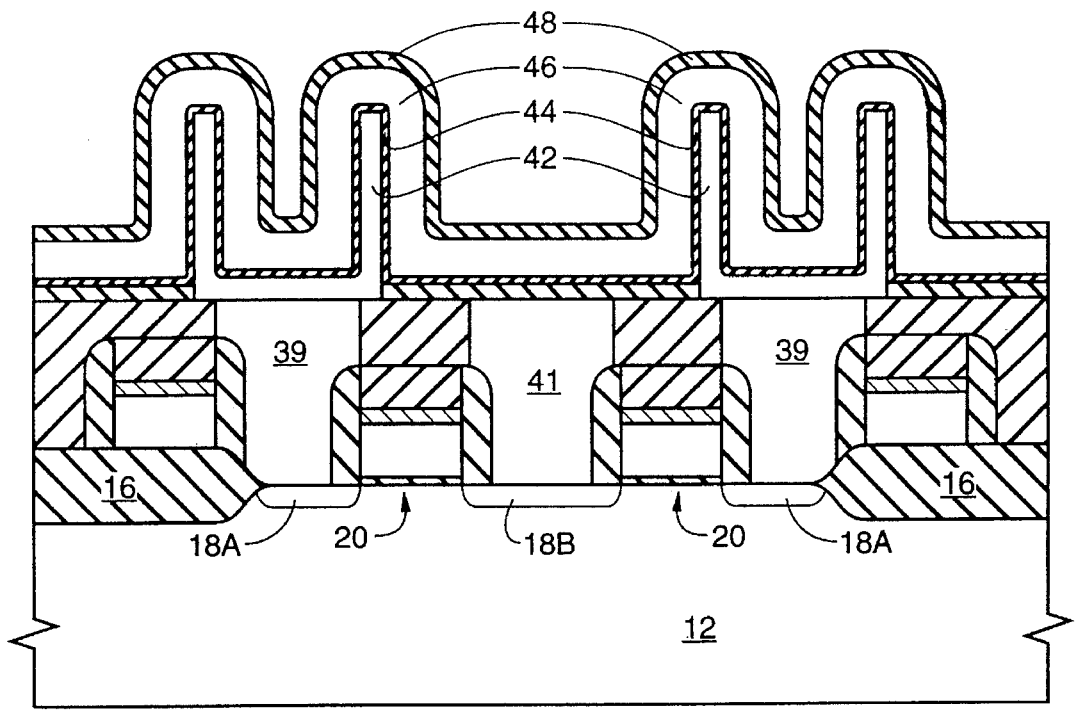

Referring to FIG. 4, capacitor dielectric 44 is deposited. Capacitor dielectric 44 is made of silicon nitride or other suitable material. Cell poly 46 is then deposited. Cell poly 46 is also referred to herein as the capacitor second conductor. Cell poly 46 is deposited so that it bridges between adjoining storage nodes 42 as shown on the far left and right portions of FIG. 4 and as illustrated in FIG. 6B. Bridging is not necessary but it is preferred because it makes the process more robust. That is, bridging helps protect the inter-node areas during etching of the bit line contact corridor and, correspondingly, eases the restrictions on those etches. Capacitor insulating layer 48 is deposited over cell poly 46. Capacitor insulating layer 48 is preferably made of silicon dioxide, but may be made of silicon nitride or other suitable insulating material.

Figure 5:
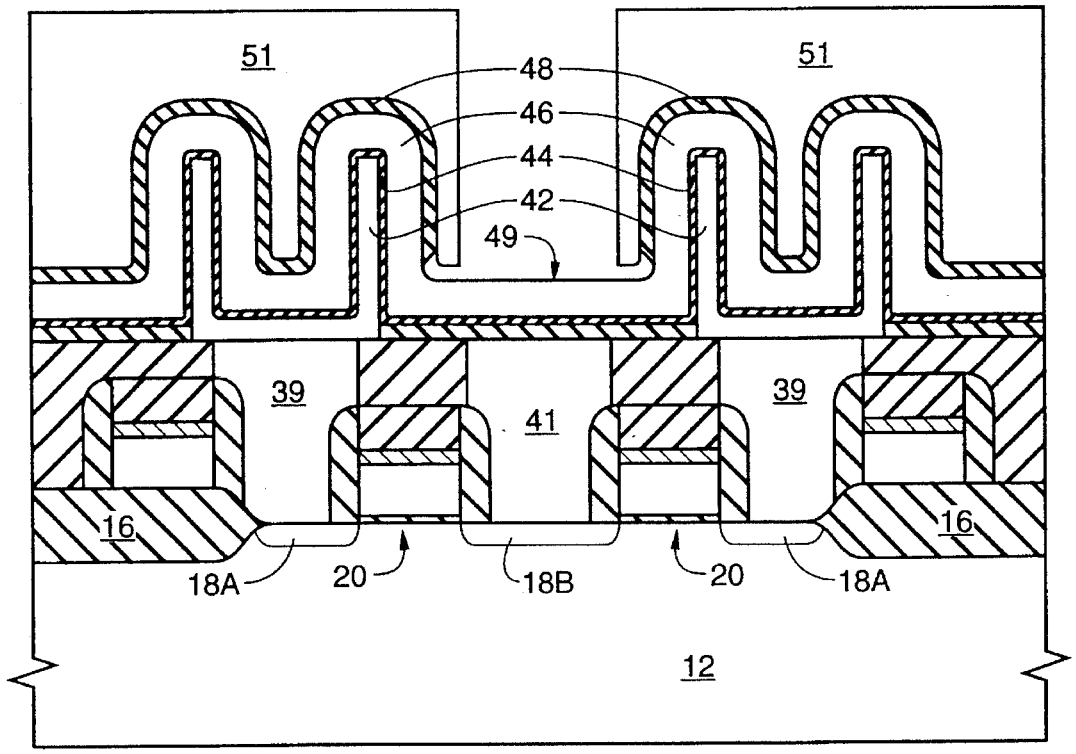

Referring to FIG. 5, capacitor insulating layer 48 is patterned and etched, using a wet or dry isotropic etch, at least back to the sides of storage nodes 42, to expose cell poly 46 at bit line contact area 49 and thereby create a hard mask along the tops and sides of storage nodes 42. FIG. 5 shows capacitor insulating layer 48 after it has been etched and before the removal of photoresist mask 51. The timing of the etch of capacitor insulating layer 48 is not critical as capacitor insulating layer 48 will act as an effective hard mask for the cell poly etch described below even if it is etched back and somewhat up the sides of storage nodes 42.

Figure 6A:
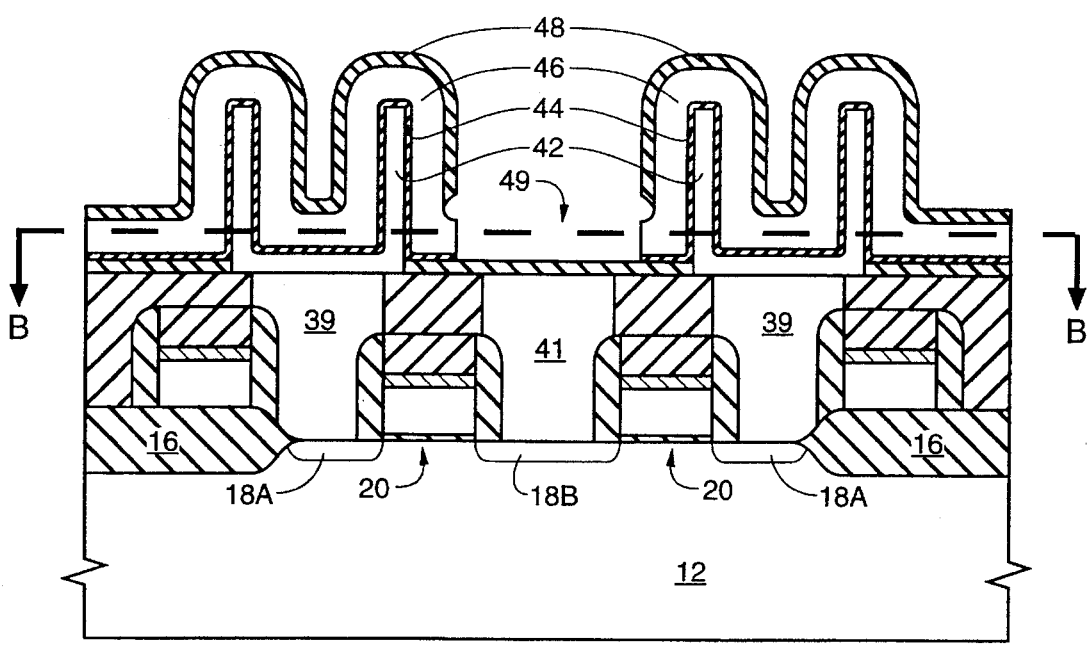
FIG. 6A is a cross section view taken along the line A—A in FIG. 6B.
Figure 6B:
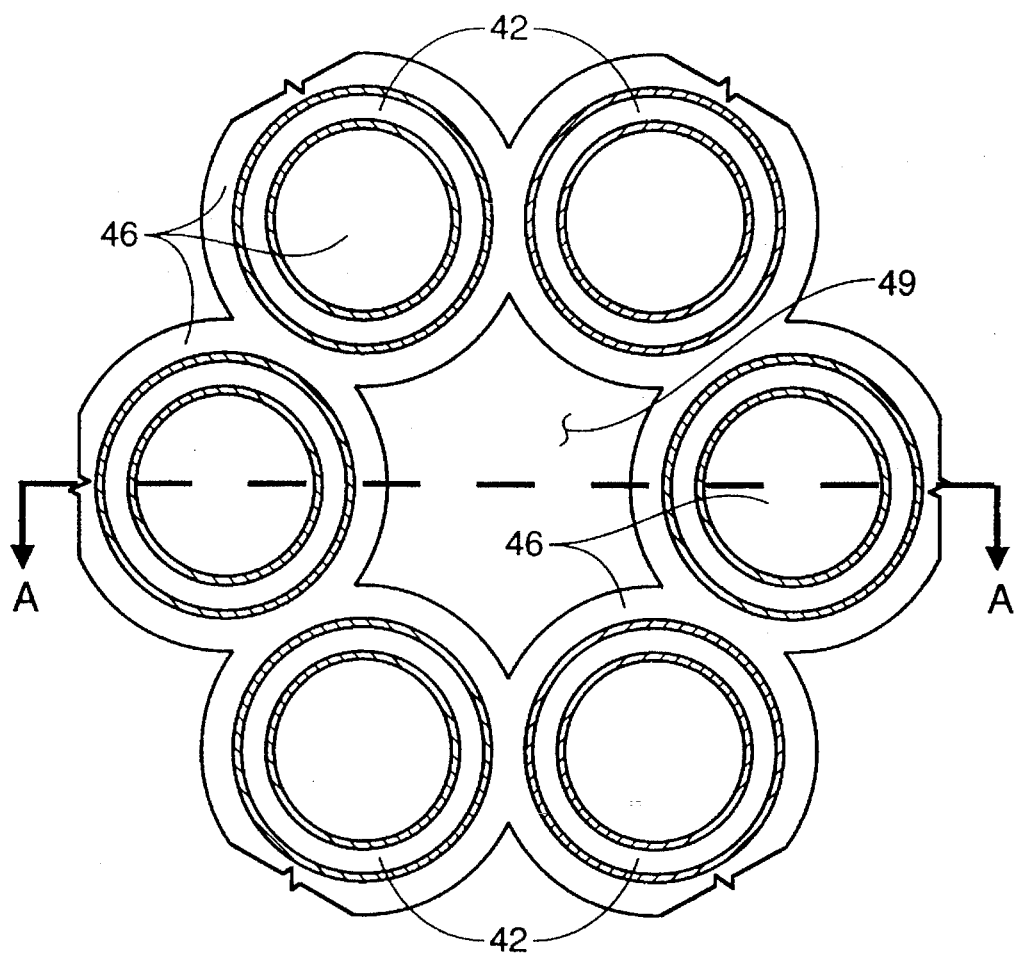
FIG. 6B is a top down cross section view taken along the line B—B in FIG. 6A.

Referring to FIG. 6A, using capacitor insulating layer 48 as a hard mask, cell poly 46 is etched and the etch may continue down through capacitor dielectric 44, stopping on etch stop layer 43. FIG. 6B is a top down cross section view illustrating the device structure after the cell poly etch. This cell poly etch is preferably anisotropic, but a timed isotropic etch may also be used. The use of capacitor insulating layer 48 as a hard mask for the cell poly etch allows bit line contact area 49 to be cleared of poly to the edge of storage node 42 without uncovering the vertical portion of capacitor dielectric layer 44, thereby minimizing the need for reoxidation of capacitor dielectric layer 44. This aspect of the invention allows bit line contact area 49 to remain large and eliminates the need for a spacer etch inside a deep contact corridor. The larger bit line contact area allows for greater misalignment tolerances during formation of the bit line contact.

Figure 7:
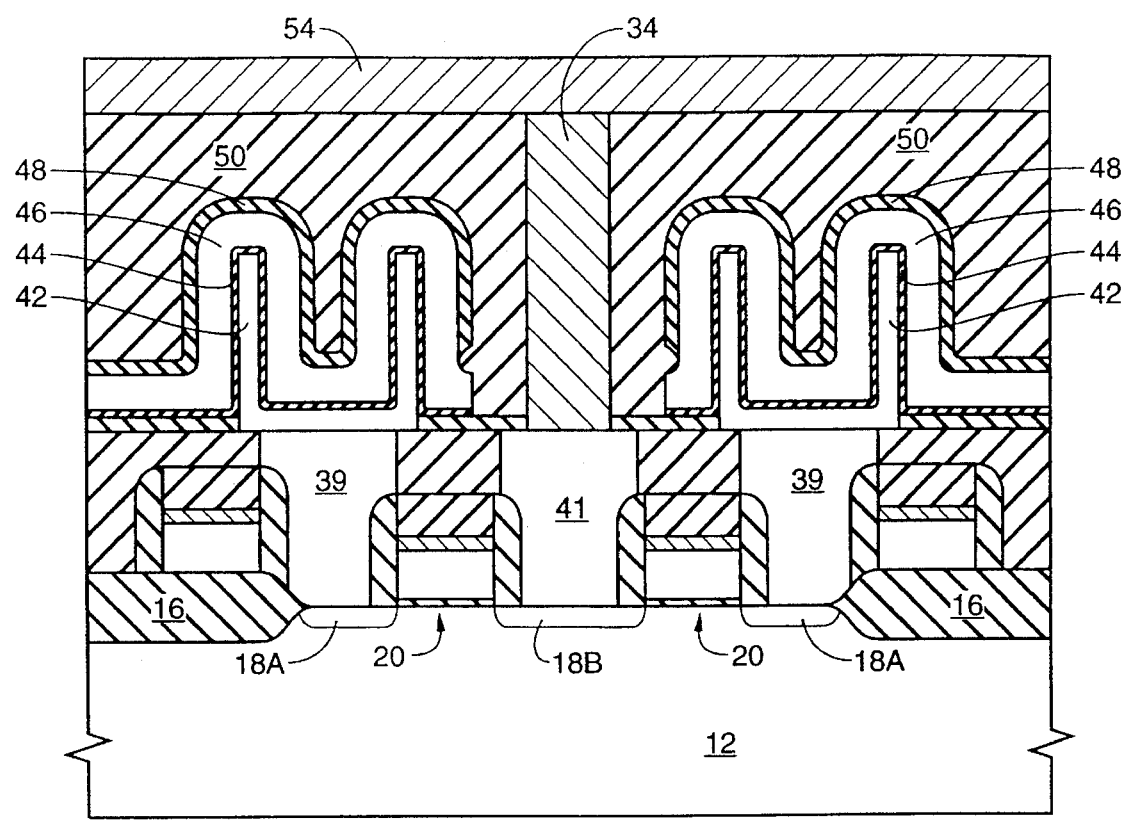

Referring to FIG. 7, a thick upper insulating layer 50 of BPSG or other suitable insulating material is formed over the exposed upper surfaces of the structure previously formed. Upper insulating layer 50 may be planarized using CMP or other suitable processes prior to etching. Upper insulating layer 50 is patterned and etched to form an opening for bit line contact 34. Bit line contact 34 and bit line 54 are formed using metal deposition techniques well known in the art.

The particular dimensions of the various layers and components described above can vary widely. The following are the nominal sizes of components in the preferred embodiment as well as an approximate range for each of the important dimensions, assuming a 64 Mbit DRAM using about a 1.6 $\mu m^2$ cell spacing: field oxide regions 16 are about 4000 angstroms thick; thin gate insulating layer 14 is about 125 angstroms thick; lower insulating layer 36 and poly plugs 39 and 41 are about 3000 angstroms wide; storage nodes 42 and cell poly 46 are about 1000 angstroms thick; capacitor dielectric layer 44 is about 80 angstroms thick; capacitor insulating layer 48 is about 100–2000 angstroms thick (depending on the level of bridging desired); upper insulating layer 50 is about 4000 angstroms thick above cell poly 46; transistor gate electrodes 22 are about 0.4 $\mu m$ wide; insulating spacers 30 are about 0.2 $\mu m$ wide; and bit line contact 34 is about 0.4 $\mu m$ wide.

An alternative embodiment of the invention will now be described with reference to FIGS. 8–14. In this embodiment, capacitor storage nodes 42 and bit line contact 34 are formed in direct contact with source/drain regions 18a and 18b. For convenience, the reference numerals for the various components are the same as those used to describe the preferred embodiment. The materials and processes used to form the components shown in FIGS. 8–14 are essentially the same as those used for the preferred embodiment described above.

Figure 8:
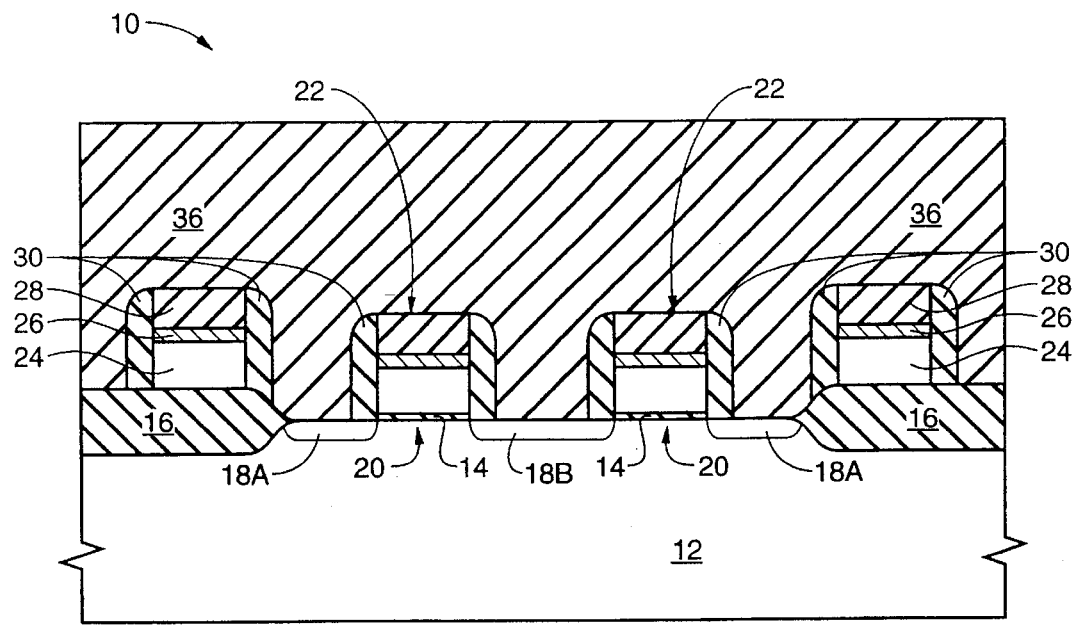
FIGS. 8–14 are cross section views of a portion of a DRAM memory cell at various stages of formation illustrating another embodiment of the invention.

Referring to FIG. 8, substrate 12 is oxidized to form thin gate insulating layer 14 and thick field oxide regions 16. Impurities are implanted in the surface of substrate 12 to form source/drain regions 18a and 18b which serve as source and drain regions for access transistors 20. Transistor gate electrodes 22 comprise a first polysilicon layer 24, a tungsten silicide layer 26 and gate insulating protective layer 28. Insulating spacers 30 are formed on either side of transistor gate electrodes 22. Lower insulating layer 36 is then deposited and, if necessary, planarized.

Figure 9:
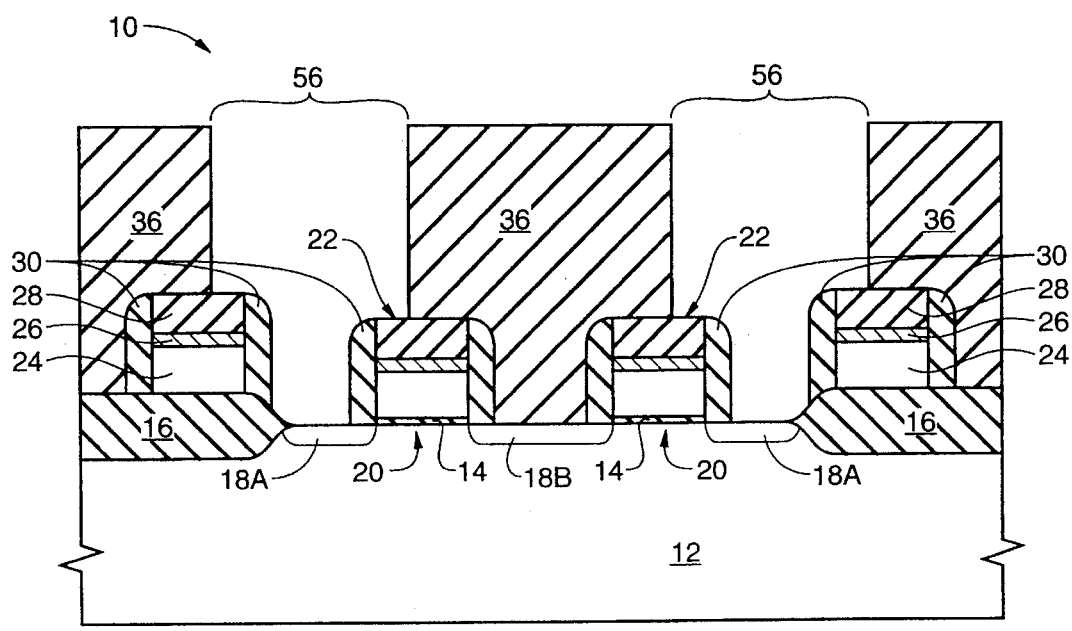

Referring to FIG. 9, lower insulating layer 36 is patterned and etched to define capacitor container 56 in lower insulating layer 36 and to expose portions of substrate 12 at source/drain regions 18a.

Figure 10:
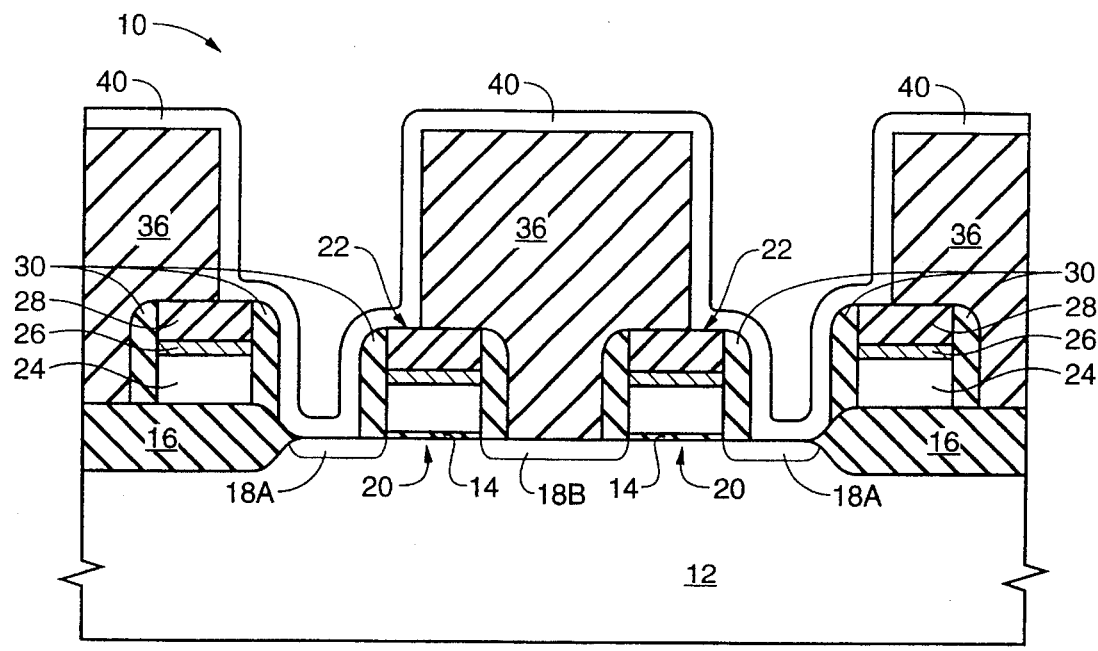
Figure 11:
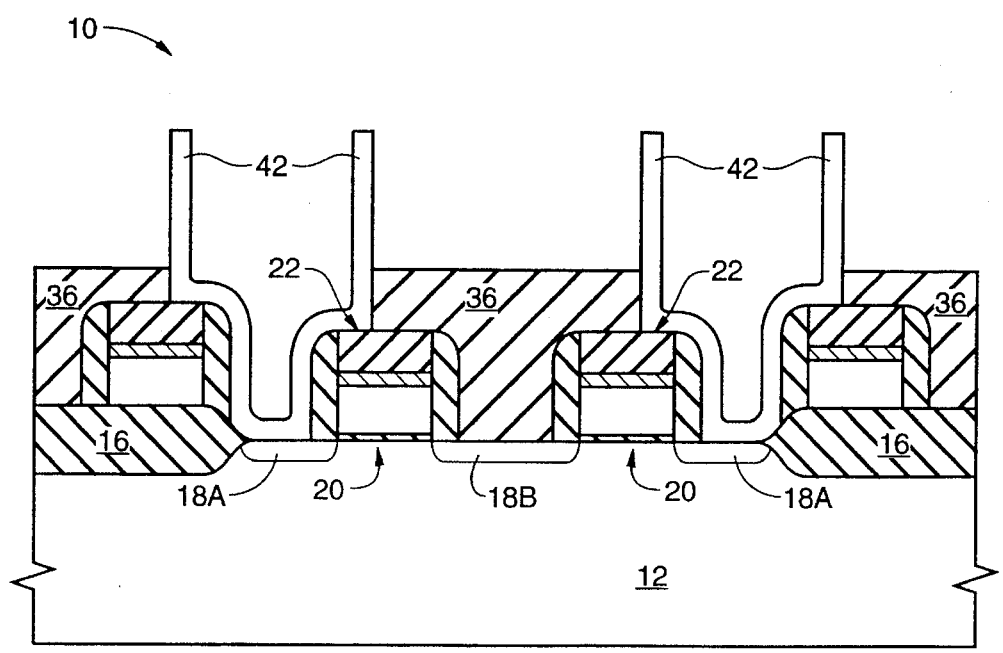

Referring to FIG. 10, storage poly 40 is deposited. Storage poly 40 may be doped polysilicon or doped rough textured polysilicon. Storage poly 40 is patterned and etched to form capacitor storage nodes 42. This storage poly etch may be followed with a partial oxide etch of lower insulating layer 36 which is selective to polysilicon so as not to etch the exposed storage poly. This oxide etch exposes much of the outer peripheries of storage nodes 42 as shown in FIG. 11, which significantly increases the capacitance area of the cell.

Figure 12:
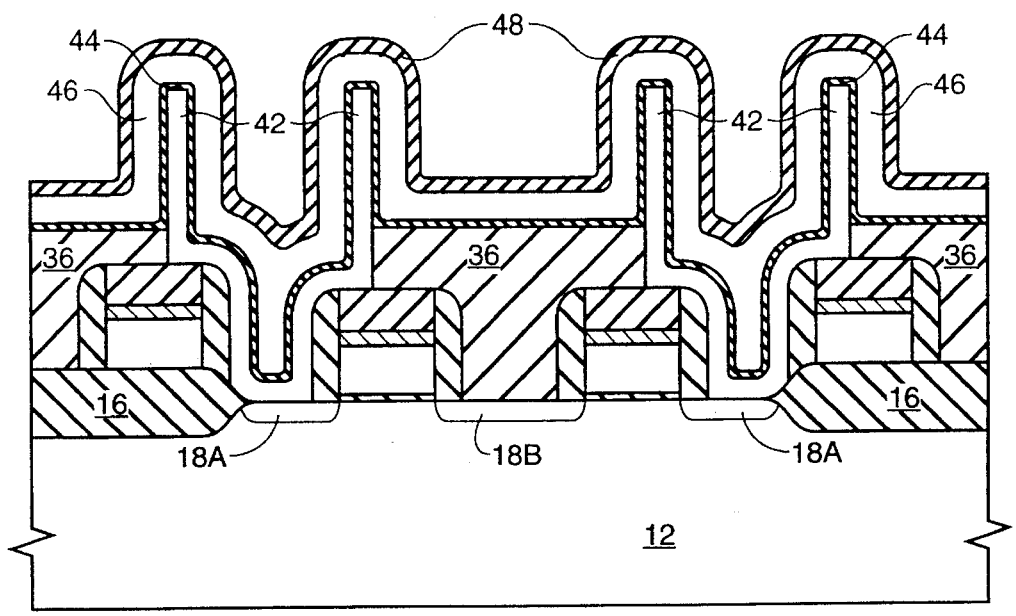
Figure 13:
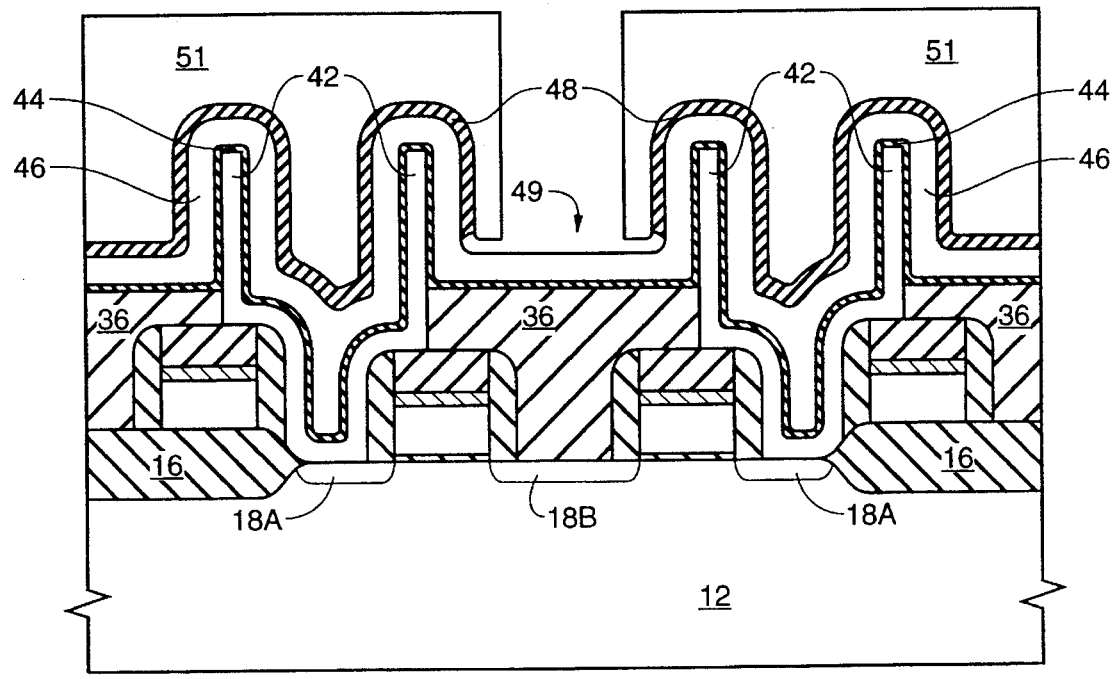

Referring to FIG. 12, capacitor dielectric layer 44 is deposited over storage nodes 42 and lower insulating layer 36. Cell poly 46 is then deposited over capacitor dielectric layer 44. Capacitor insulating layer 48 is deposited over cell poly 46. Referring to FIG. 13, capacitor insulating layer 48 is patterned and etched at least back to the sides of storage nodes 42 to expose cell poly 46 at bit line contact area 49 and thereby creating a hard mask along the tops and sides of storage nodes 42.

Referring to FIG. 14, using capacitor insulating layer 48 as a hard mask, cell poly 46 is etched and the etch may continue down through capacitor dielectric layer 44 stopping on lower insulating layer 36. Thick upper insulating layer 50 of BPSG is formed over the exposed upper surfaces of the structure previously formed. Upper insulating layer 50 is then patterned and etched to form an opening for bit line contact 34. Bit line contact 34 and bit line 54 are formed using metal deposition techniques well known in the art.

There has been shown and described a novel, simplified integrated circuit and formation process which can be utilized to fabricate more compact and better performing DRAMs. The particular embodiments shown in the drawings and described herein are for purposes of example and should not be construed to limit the invention as set forth in the appended claims. Those skilled in the art may now make numerous uses and modifications of the specific embodiments described without departing from the scope of the invention. The process steps described may in some instances be performed in a different order and/or equivalent structures and processes may be substituted for the various structures and processes described. A variety of different dimensions and materials may also be used.

We claim:

1. A method of making an integrated circuit device, comprising:
   a. forming first and second structures each having a vertical sidewall;
   b. forming a first layer of material conforming to, and extending between the vertical sidewalls;
   c. forming a mask layer conforming to the first layer, wherein the mask layer has a horizontal region between the vertical sidewalls and vertical regions along the vertical sidewalls;
   d. patterning and etching the mask layer to remove the horizontal region of the mask layer, thereby exposing portions of the first layer between the vertical sidewalls, while retaining at least a portion of each vertical region of the mask layer; and
   e. using the remaining mask layer as an etch mask, etching away the exposed portions of the first layer.

2. A method of making an integrated circuit device according to claim 1 wherein the first layer is preferentially etchable with respect to the mask layer.

3. A method of making an integrated circuit device according to claim 1, wherein the first layer is made of electrically conductive material and the mask layer is made of electrically insulating material.

4. A method of making an integrated circuit device, comprising:
   a. forming a capacitor over a semiconductor wafer, the capacitor comprising a vertical first conductor, a dielectric layer on the first conductor and a second conductor in the dieletrically layer, whereby the second conductor has a vertical portion parallel to the first conductor;
   b. forming a capacitor insulating layer on the second conductor;
   c. patterning and etching the capacitor insulating layer to expose portions of the second conductor at a location of a bit line contact; and
   d. using the capacitor insulating layer as mask, etching away the exposed portions of the second conducting layer.

5. A method of making an integrated circuit device according to claim 4, wherein the capacitor insulating layer is etched back to the vertical portion of the second conductor.

6. A method of making an integrated circuit device according to claim 4, wherein the capacitor insulating layer is made of silicon dioxide.

7. A method of making an integrated circuit device according to claim 4, wherein the capacitor insulating layer is made of silicon nitride.

8. A method of making an integrated circuit device according to claim 4, wherein the capacitor insulating layer is etched using an isotropic etch.

9. A method of making an integrated circuit device, comprising:
   a. forming on a semiconductor wafer a plurality of transistors each comprising a gate insulating layer on a substrate and a gate electrode on the gate insulating layer;
   b. forming first and second source/drain regions on the substrate adjacent to sides of at least one of the gate electrodes;
   c. forming a lower insulating layer over the substrate;
   d. patterning and etching the lower insulating layer to define a capacitor container in the lower insulating layer and to expose portions of the first source/drain region within the capacitor container;
   e. forming a vertical first conductor in the capacitor container so that a portion of the first conductor contacts the first source/drain region;
   f. forming a dielectric layer on the first conductor;
   g. forming a second conductor on the dielectric layer, whereby the second conductor has a vertical portion parallel to the first conductor;
   h. forming a capacitor insulating layer on the second conductor; and
   i. patterning and etching the capacitor insulating layer to expose portions of the second conductor at a location of a bit line contact.

10. A method of making an integrated circuit device according to claim 9, wherein the capacitor insulating layer is etched back to the vertical portion of the second conductor.

11. A method of making an integrated circuit device according to claim 9, further comprising, using the capacitor insulating layer as a mask, etching away the exposed portions of the second conductor.

12. A method of making an integrated circuit device according to claim 9, further comprising:
   a. forming an upper insulating layer over the capacitor insulating layer;
   b. patterning and etching the upper insulating layer and continuing to etch down to expose portions of the second source/drain region; and
   c. forming a bit line contact contacting the exposed portions of the second source/drain region, wherein the bit line contact is aligned with and parallel to the vertical portion of the second conductor.

13. A method of making an integrated circuit device, comprising:
   a. forming on a semiconductor wafer a plurality of transistors each comprising a gate insulating layer and a gate electrode on the gate insulating layer;
   b. forming a plurality of source/drain regions on the substrate adjacent to sides of at least one of the gate electrodes;
   c. forming a lower insulating layer over the substrate;
   d. patterning and etching the lower insulating layer to define a bit line contact corridor above one of the source/drain regions and to expose the source/drain region within the bit line contact corridor;
   e. depositing electrically conductive material in the bit line contact corridor to form a bit line contact corridor plug contacting the exposed source/drain region;
   f. forming a vertical first conductor over the lower insulating layer;
   g. forming a dielectric layer on the first conductor;
   h. forming a second conductor on the dielectric layer, whereby the second conductor has a vertical portion parallel to the first conductor;
   i. forming a capacitor insulating layer on the second conductor; and
   j. patterning and etching the capacitor insulating layer to expose portions of the second conductor over the bit line contact corridor.

14. A method of making an integrated circuit device according to claim 13, wherein the capacitor insulating layer is etched back to the vertical portion of the second conductor.

15. A method of making an integrated circuit device according to claim 13, further comprising, using the capacitor insulating layer as a mask, etching away the exposed portions of the second conductor.

16. A method of making an integrated circuit device according to claim 13, further comprising:
   a. forming an upper insulating layer over the capacitor insulating layer;
   b. patterning and etching the upper insulating layer and continuing to etch down to expose portions of the bit line contact corridor plug; and
   c. forming a bit line contact contacting the exposed portions of the bit line corridor plug, wherein the bit line contact is aligned with and parallel to the vertical portion of the second conductor.

17. A method of making an integrated circuit device, comprising:
   a. forming a plurality of capacitors over a semiconductor wafer, each capacitor comprising a vertical first conductor, a dielectric layer on the first conductor and a second conductor on the dielectric layer, wherein the second conductor has a vertical portion parallel to the first conductor and a horizontal portion bridging between adjacent capacitors;
   b. forming a capacitor insulating layer on the second conductor;
   c. patterning and etching the capacitor insulating layer to expose portions of the second conductor at a location of the bit line contact; and
   d. using the capacitor insulating layer as a mask, etching away the exposed portions of the second conducting layer.

18. A method of making an integrated circuit device according to claim 17, wherein the capacitor insulating layer is etched back to the vertical portion of the second conductor.

* * * * *